United States Patent [19]
Fanini et al.

[11] Patent Number: 5,646,561
[45] Date of Patent: Jul. 8, 1997

[54] HIGH PERFORMANCE CURRENT SWITCH FOR BOREHOLE LOGGING TOOLS

[75] Inventors: Otto N. Fanini, Stafford; Stanislav Forgang, Houston, both of Tex.

[73] Assignee: Western Atlas International, Inc., Houston, Tex.

[21] Appl. No.: 575,626

[22] Filed: Dec. 20, 1995

[51] Int. Cl.⁶ .......................... H03K 17/64; H03K 17/56
[52] U.S. Cl. .................. 327/110; 327/108; 327/443; 327/379; 327/384; 324/339
[58] Field of Search ...................... 327/108, 110, 327/170, 365, 374, 376, 377, 387, 388, 379, 442, 384, 432, 433; 326/17, 82, 83, 84; 324/339

[56] References Cited

U.S. PATENT DOCUMENTS

| | | | |
|---|---|---|---|
| 3,912,981 | 10/1975 | Tsurushima | 317/33 |
| 3,921,089 | 11/1975 | Tsurushima | 330/13 |
| 4,455,529 | 6/1984 | Sinclair | 324/339 |

FOREIGN PATENT DOCUMENTS

| | | | |
|---|---|---|---|
| 5206816 | 8/1993 | Japan | 327/110 |

Primary Examiner—Timothy P. Callahan
Assistant Examiner—Dinh Le
Attorney, Agent, or Firm—Gerald E. Lester

[57] ABSTRACT

A current switch for borehole logging tools operating at high temperatures with high load currents, which includes a driver unit that responds to an input digital control signal by holding an output field effect transistor in a turn-off state until its gate electrode is fully charged before allowing the transistor to supply current to an inductive or acoustic load, and by effecting a rapid discharge of the gate electrode to turn the transistor off. A digital coupler is inserted between the source of the input digital control signal and the driver unit to electrically decouple the load current from the source. The effects of spurious noise contaminants including power spikes in the load, fly-back coupling, and Miller's capacitance thereby are minimized and a switching action with minimal transition time is achieved. The current switch is particularly adaptable for use in a complementary-symmetric circuit for a bi-directional switch that causes current to flow first in one direction, and then in the opposite direction through the load with minimal cross propagation of noise.

28 Claims, 3 Drawing Sheets

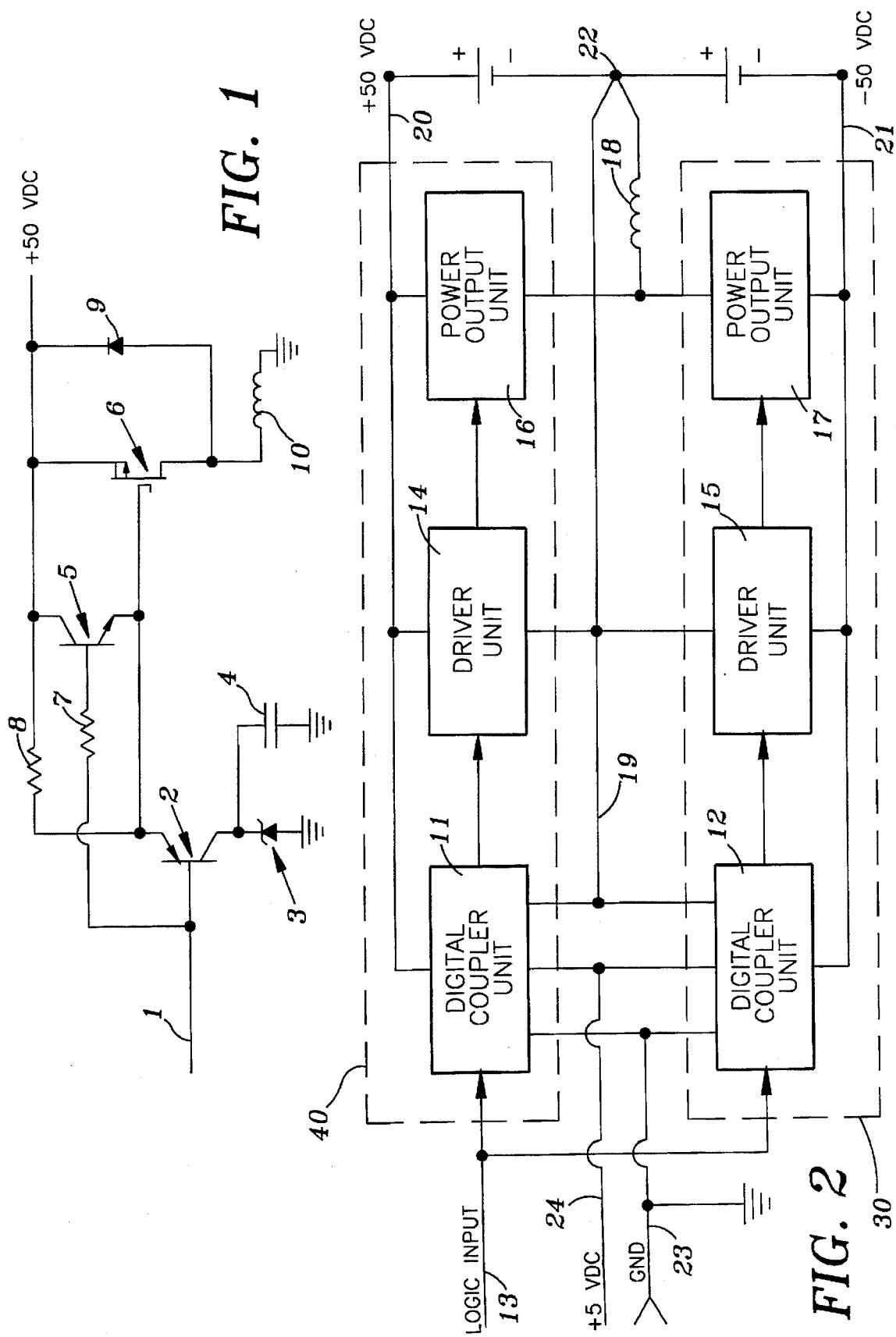

HIGH PERFORMANCE CURRENT SWITCH FOR BOREHOLE LOGGING TOOLS

FIELD OF THE INVENTION

The invention is directed in general to inductive or acoustic borehole logging tools as used in the oil and gas industries, and more specifically to a current switch that is used in a logging tool to accommodate rapid changes in direction of current in an antenna which radiates subsurface formations with magnetic or sound fields at high frequencies.

BACKGROUND OF INVENTION

In the oil and gas industry, it is important to learn the nature and characteristics of sub-surface formations in order to locate oil and gas deposits. Information gained by drilling a borehole and testing core samples usually is not sufficient to form a decision as to the existence of acceptable levels of hydrocarbons that would justify a drilling operation.

In order to supplement the above bore hole information, induction logging tools such as that disclosed in U.S. Pat. No. 4,455,529 have been used to measure the resistivity or conductivity of sub-surface formations. An AC magnetic field is transmitted by an antenna to induce eddy currents in the sub-surface formations. Variations in the magnitude of the eddy currents (relating to variations in the formation conductivity) are reflected as variations in the received signal. The presence of hydrocarbons in the sub-surface formation is indicated by low conductivity measurements.

An acoustic logging tool acts in a similar manner by transmitting an AC sound wave that propagates through the subsurface formations. Variations in the received signal indicates changes in sound flux that may be caused by formation pockets or cavities in which hydrocarbons are trapped.

Application and power restrictions have prompted the use of higher frequencies (ten to several hundred kilohertz) with shorter pulse widths. The higher frequency operation in the high temperature environment (up to 200 degrees Centigrade) of a logging tool in a borehole gives rise to a deterioration in the received signal which is caused by spurious transmitter distortions such as power spikes, flyback coupling, Millers capacitance and other noise contaminants. In addition, the switch electronics that is used in the transmitter must be adapted to accommodate high currents of up to several amps that may occur with transient times of less than a hundred nanoseconds in a load or antenna.

Conventional switch electronic systems may include transistor amplifier circuits similar to those disclosed in U.S. Pat. No. 3,912,981 and U.S. Pat. No. 3,921,089. Each is comprised of an input stage which is the source of a signal to be applied through the switch electronics to an inductive load, a biasing current stage comprised of bipolar transistors to supply gate bias voltages to the power end of the switch, and an output stage comprising Field Effect Transistors (FETs) which turn on and off in response to the biasing circuit to supply current to the inductive load.

These traditional designs, however, do not adequately reduce the effects of fly-back coupling, Miller's capacitance, parasitic power spikes, the drain-to-gate and source-to-gate capacitances occurring in the output stage FETs, and the collector-to-base and emitter-to-base capacitive coupling occurring in Bipolar Junction Transistors, to avoid switch time deterioration in a high frequency, high temperature operation that includes currents of 2–3 amps or more with extremely short transient times in a load.

SUMMARY OF THE INVENTION

The invention is directed to a current switch with high switching speed which uses an emitter follower transistor interconnected with a bi-polar transistor having complementary dopants (NPN,PNP) to hold a MOSFET power transistor in an off state, until its gate electrode is fully charged by a digital control signal before allowing the power transistor to turn on. In addition, the emitter follower and bipolar transistor interact to quickly discharge the gate electrode to turn the power transistor off. A switching action with minimal transition time is thereby achieved with electrical decoupling between the digital control signal and the output current of the power transistor.

In another embodiment of the invention, a bi-directional current switch for an inductive logging tool is used to substantially reduce noise that may be incurred at high frequency, high temperature operation of the tool with substantial load currents of the order of 2–3 amps or more that have transient times of 50 nanoseconds or less. Complementary circuits (each comprised of a digital coupler, a drive unit, and a power output unit) are used to process positive and negative pulses comprising the input digital control signal of the switch. This arrangement allows the output of the power output units of each circuit that supply current to the load to be noise isolated from the input digital control signal, and the driver units that supply gate voltages to the FETs of the power output units to be electrically decoupled from each other. The drive units are comprised of emitter followers which are electrically interconnected with bipolar transistors in a manner to hold the FETs comprising the power output units off until their gate electrodes are fully charged, and to quickly discharge the gate electrodes to turn the FETs off. A switching action with minimal transition time thereby is achieved. In addition, the drains of the power output FETs are connected to prevent self-oscillation. A back-coupling, noise generating, load and circuit interconnection effect which eventually imposes a decreasing circuit operating frequency and slower switching speeds, and which is exacerbated by the presence of Miller's capacitance, the drain-to-gate and source-to-gate capacitances occurring in the FETs, and the collector-to-base and emitter-to-base capacitance occuring in the bipolar junction transistors, is thereby prevented.

BRIEF DESCRIPTION OF THE DRAWINGS

FIG. 1 is an electrical schematic diagram of a current switch in accordance with the invention;

FIG. 2 is a functional block diagram of a bi-directional switch in accordance with the invention;

DESCRIPTION OF PREFERRED EMBODIMENTS

Figure 3:
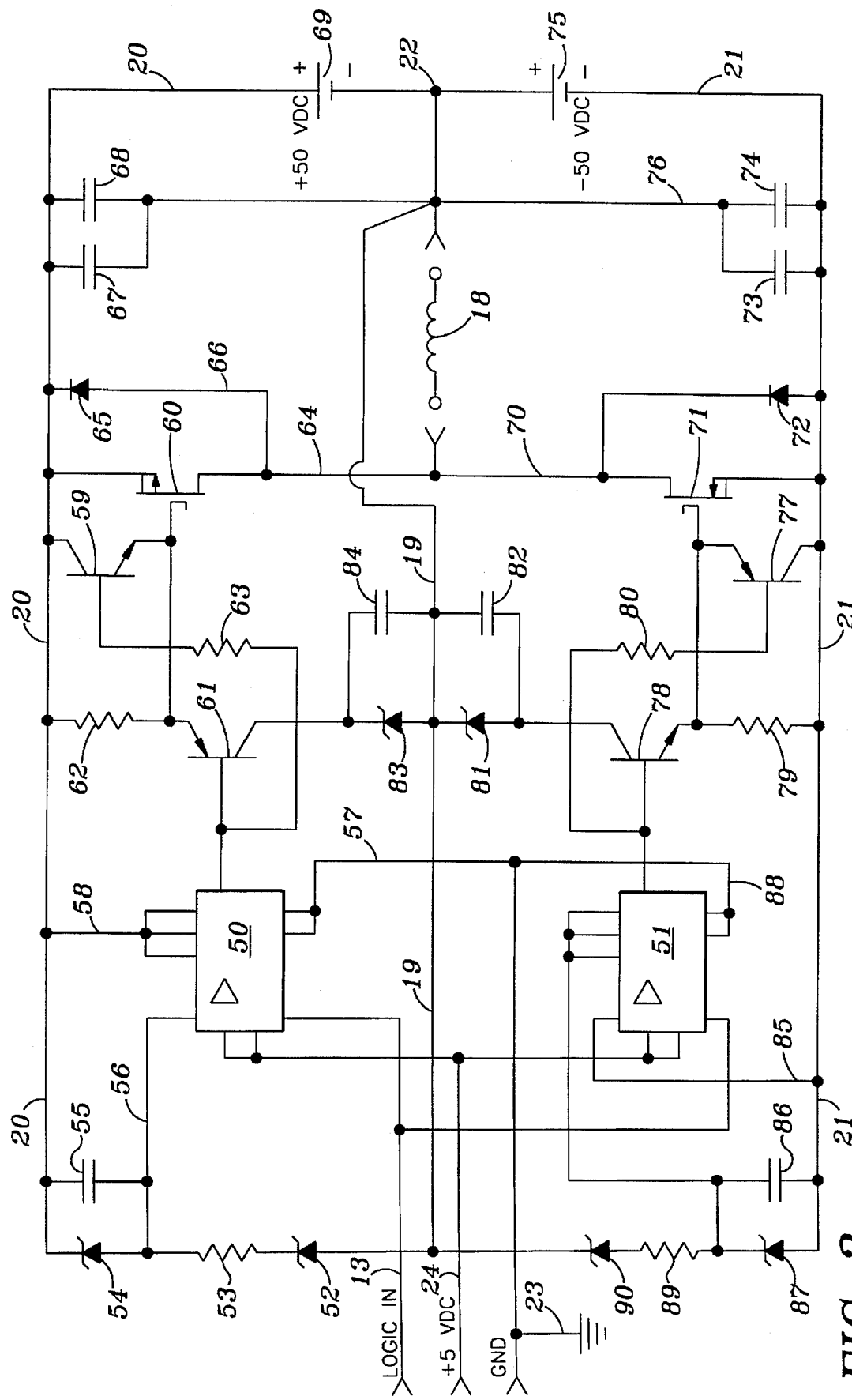
FIG. 3 is an electrical schematic diagram of the bi-directional switch of FIG. 2.

Referring to FIG. 1, an input digital control signal on line 1 is applied to the base electrode of a bipolar PNP transistor 2, the collector electrode of which is electrically connected to the cathode of a zener diode 3 and to one terminal of a 0.47 μF capacitor 4. The anode of the zener diode 3 and the second terminal of capacitor 4 are each electrically connected to the switch power supply ground.

The emitter electrode of transistor 2 is electrically connected to the emitter electrode of an NPN bipolar transistor 5 and to the gate electrode of a p-channel MOSFET power transistor 6. The base electrode of transistor 2 is electrically connected through a 100 ohm resistor 7 to the base electrode of transistor 5, and the emitter electrode of transistor 2 further is electrically connected through a 470 ohm resistor 8 to the collector electrode of transistor 5.

The collector electrode of transistor 5 also is electrically connected to the source electrode of transistor 6, to the cathode of a diode 9, and to a +50 VDC switch power supply. The drain electrode of transistor 6 is electrically connected to the anode of diode 9, and through an inductive or acoustic antenna 10 to the switch power supply ground.

In operation, when the input digital control signal on line 1 is negative with respect to the +50 VDC power supply potential, transistor 2 is closed (turned on) and transistor 5 is open (turned off), thereby negatively charging the gate electrode of the MOSFET transistor 6 to cause the transistor to close. Current thereupon flows from the source electrode to the drain electrode of transistor 6, and through the load or antenna 10 to the switch power supply ground.

When the input digital control signal potential on line 1 approaches zero volts as referenced to the +50 VDC switch power supply potential, transistor 2 is open (turned off) and transistor 5 is closed (turned on) to discharge the gate electrode of transistor 6 which is then turned off. In this state, no drain current flows through the load 10.

As will be discussed in more detail below, the charge time to turn on the MOSFET transistor 6 is limited by the resistor 8 and is of the order of 50 nanoseconds or less. The discharge time of the gate electrode of transistor 6 is controlled by transistor 5 and also is of the order of fifty nanoseconds. The zener diode 3 and capacitor 4 interact to limit the voltage applied to the gate electrode of transistor 6, and to reduce the amount of voltage that is applied to the collector of transistor 2.

Thus, the transistor 2 supplies the switch command voltage for charging and discharging the gate electrode of the transistor 6. When the output of transistor 2 is charging the gate electrode of transistor 6, the transistor 5 interacts with the transistor 2 to hold the transistor 6 off until the gate electrode is charged. Thereafter, the transistor 6 is allowed to turn on to supply current to the load. When the output of transistor 2 commands a discharge of the gate electrode of transistor 6, the transistor 5 interacts with the transistor 2 to cause the discharge to occur rapidly.

In order to cause current to flow in an opposite direction through load 10, transistor 2 would be changed to an NPN bipolar transistor, transistor 5 would be changed to a PNP transistor, the p-channel MOSFET power transistor 6 would be changed to an n-channel MOSFET power transistor, and the +50 VDC power supply would be changed to a −50 VDC power supply. In this configuration the circuit would respond to a signal on line 1 which is positive with respect to the −50 VDC switch power supply potential to cause current to flow through antenna or load 10 in the opposite direction.

Referring to FIG. 2, a functional block diagram of a bi-directional current switch incorporating the invention is illustrated. A +5 VDC power supply is connected to first inputs of a digital coupler unit 11 and to first inputs of a digital coupler unit 12. A digital control signal on line 13 is applied to the control input section of coupler units 11 and 12, and the electrical signals issued by the control output section of the coupler units are respectively applied to the inputs of driver units 14 and 15. The driver units are bias circuits which supply gate voltages to the gate electrodes of power FETs that comprise the power output units 16 and 17. The outputs of the units 16 and 17 in turn are connected through a load 18 to a line 19, and to a mid-terminal ground 22 between the +50 VDC terminal on line 20 and the −50 VDC terminal on line 21 of a ±50 VDC switch power supply. The mid-terminal ground has no galvanic connections with tool wires or main logging tool power supplies, except through ground return to the ±50 VDC switch power supply and the load 18. Line 19 also is electrically connected to ground terminals of driver units 14 and 15, and of the control output section of coupler units 11 and 12. The +50 VDC voltage on line 20 is connected to voltage inputs of power output unit 16, driver unit 14, and coupler unit 11. Further, the −50 VDC voltage on line 21 is applied to voltage inputs of power output unit 17, driver unit 15, and coupler unit 12. The ground 23, which serves as a reference for the +5 VDC power supply on line 24 and the digital control signal on line 13, is electrically connected to ground terminals of the control input section of coupler units 11 and 12. The ground 23 is electrically isolated from the mid-terminal ground 22.

In order to reduce the effects of noise at high frequency, high temperature operation with high load amperage, the bi-directional switch of FIG. 1 is designed to isolate the ±50 VDC source from the +5 VDC source, and the output of units 16 and 17 from the digital control signal input on line 13. In addition, the input and output control signals of the upper circuit comprising coupler unit 11, driver unit 14 and power output unit 16 are decoupled from the lower circuit comprising coupler unit 12, driver unit 15 and power output unit 17. Further, the digital control signal inputs to the coupler units 11 and 12 operate with reference to the logging tool ground 23, while the outputs of the coupler units operate with reference to the mid-terminal ground 22 of the switch power supply.

More particularly, the high input impedance and low output impedance of emitter followers in the driver units and of FETs in the power output units provide an inherent noise isolation between the outputs and inputs of the units. Further, coupling that otherwise could occur as a result of Miller's capacitance is nullified by extremely small switch transitions to accommodate changes in load current directions, by a common FET drain connection between the power output units through the load 18 to the switch power supply ground, and by the ground connections along line 19. In addition, noise propagation from the load 18 is repressed by the isolation of the tool ground 23 from the mid-terminal ground 22, and the isolation provided by the digital coupler units 11 and 12 between the load 18 and the digital control signal input on line 13. Other noise abating implementations will become apparent in the description of the remaining Figures.

The terms "isolation" and "decoupling" as used in this specification are distinctly different. By way of explanation, there normally is a path between any two nodes in an electrical circuit which determines how the behavior of one node will affect the behavior of the other node. This dependence can be termed a "coupling". In order to decouple the two nodes, an electrical isolator such as the couplers 11 and 12 may be placed in the electrical path between the two nodes. If the isolator exhibits an impedance which is much higher than that of other electrical paths connected to the two nodes, the behavior of one node will not affect the other node. In this event, the nodes are said to be decoupled.

In operation, a digital control signal is applied on line 13 to the data inputs of coupler units 11 and 12. The outputs of the coupler units are applied respectively to the inputs of driver units 14 and 15. The driver units 14 and 15 in turn generate driving voltages which are applied respectively to the power output units 16 and 17.

In the switch circuit of FIG. 2, the digital coupler units 11 and 12 may be capacitive couplers for high temperature operation (up to 200° C.), optical couplers for low temperature operation up to 120° C., or transformers at temperatures up to 200° C. if some degradation in performance can be tolerated. Further, the load 18 may be either an inductive antenna or an acoustical antenna having a high impedance for generating a low current, high voltage signal to radiate subsurface formations at high frequency to detect transitions in the formations.

The lower circuit 30 (below line 19 and load 18) comprising coupler unit 12, driver unit 15, and power output unit 17 is the complement of the upper circuit 40 comprised of coupler unit 11, driver unit 14 and power output unit 16. The upper circuit 40 causes current to flow into the load 18 in response to negative going transition signals received on the input line 13, and the lower circuit 30 causes current to flow into the load 18 in the opposite direction in response to positive going transition signals on the input line 13. More particularly, the negative going signals at the output of the coupler unit 1 late applied to the driver unit 14, which generates a driving voltage that causes the power output unit 16 to generate a current that is applied through the load 18 in a first direction.

In like manner, the positive going signals in the input 13 are applied through the coupler unit 12 to the driver unit 15, which generates a driving voltage to cause the power output unit 17 to generate a current which is applied through the load 18 in a second direction. The change in direction of current causes a voltage to be generated in the antenna or coil of the inductive load 18, which excites the subsurface formations to produce eddy currents. The occurrence of hydrocarbons in the subsurface formations will be reflected by the occurrence of low conductivity, and as a consequence, a reduction in the magnitude of a received signal as measured by the receiver circuitry of the logging tool.

As another noise abating feature, the coupler units 11 and 12, the driver units 14 and 15, and the power output units 16 and 17 are low power units which collectively draw from the switch power supply less than 150 milliamps in addition to the current delivered to the load 18.

In the descriptions of the Figures which follow, the reference numbers are used consistently so that same reference numbers refer to same devices.

Referring to FIG. 3, a detailed electrical schematic of the invention is illustrated in which a +5 VDC voltage is applied along line 24 to first inputs of a first digital coupler 50 and to first inputs of a second digital coupler 51. A digital control signal on line 13 is applied to the data inputs of the couplers 50 and 51.

The logging tool ground 23 is connected to ground terminals of the control input sections of couplers 50 and 51. As before stated, the ground 23 serves as a reference for the +5 VDC power supply on line 24 and the digital control signal on line 13.

The couplers 50 and 51 provide ultra-fast signal transmission from their electrically separated inputs and outputs, and exhibit excellent rejection of high frequency back coupling from the outputs to the inputs of the couplers. The couplers also greatly reduce the effects of current spikes on power lines and exhibit substantial immunity from transients. For high temperature operation (above 100° C.), couplers 50 and 51 may be capacitive couplers that are commercially available from the Burr-Brown Corporation of Tucson, Ariz. as "Dual, Isolated, Bi-Directional Digital Couplers", Part No. ISO150AP.

For the discussions which follow, the digital couplers 50 and 51 are presumed to be the capacitive couplers identified above, and the coupler connections that are illustrated are those recommended by the manufacturer.

Continuing with the description of FIG. 3, the anode of a zener diode 52 is electrically connected to the mid-terminal ground 22 of a ±50 VDC switch power supply by way of line 19. The cathode of the diode is electrically connected through a 100 ohm resistor 53 to the anode of a zener diode 54, to one terminal of a 10 μF capacitor 55, and by way of a line 56 to a second input of coupler 50. The ground terminals of coupler 50 are connected by way of a line 57 to the logging tool ground 23.

The cathode of diode 54 is electrically connected to the other terminal of capacitor 55, and by way of line 20 to a line 58 leading to the three bias voltage inputs of coupler 50 and to the collector electrode of an NPN bi-polar transistor 59. The emitter of transistor 59 is electrically connected to the gate electrode of a p-channel MOSFET power transistor 60, to the emitter of a PNP bi-polar transistor 61, and through a 470 ohm resistor 62 to the collector of transistor 59 and to the source electrode of transistor 60. The base electrode of transistor 61 is electrically connected to the output of coupler 50 and through a 100 ohm resistor 63 to the base electrode of transistor 59.

The drain electrode of transistor 60 is electrically connected by way of a line 64 to the load 18, the opposite end of which is electrically connected to the mid-terminal ground 22. The drain electrode of transistor 60 further is electrically connected by way of a line 66 to the anode of a diode 65. The cathode of diode 65 is electrically connected to the source electrode of transistor 60, to a first terminal of a 0.47 μF capacitor 67, to a first terminal of a 47 μF capacitor 68 in parallel with capacitor 67, and by way of line 20 to the +50 VDC terminal 69 of a ±50 VDC switch power supply. The mid-terminal ground 22 of the power supply is electrically connected to one end of the inductive load 18. The other end of the load 18 is electrically connected to line 64, and by way of a line 70 to the drain electrode of an n-channel MOSFET power transistor 71. The source electrode of the transistor 71 is electrically connected to the anode of a diode 72, the cathode of which is electrically connected to the drain electrode of transistor 71. The anode of diode 72 further is electrically connected to a first terminal of a 0.47 μF capacitor 73, to a first terminal of a 47 μF capacitor 74 in parallel with capacitor 73, and by way of line 21 to the −50 VDC terminal 75 of the switch power supply. Second terminals of capacitors 73 and 74 are electrically connected to the mid-terminal ground 22 by way of a line 76.

The gate electrode of transistor 71 is electrically connected to the emitter electrode of a PNP bi-polar transistor 77 and to the emitter electrode of an NPN bi-polar transistor 78. The collector electrode of transistor 77 is electrically connected to the source electrode of transistor 71, and through a 470 ohm resistor 79 to the emitter electrode of transistor 78 and to the gate electrode of transistor 71.

The base electrode of transistor 77 is electrically connected through a 100 ohm resistor 80 to the base electrode of transistor 78 and to the output of the coupler 51. The collector of transistor 78 is electrically connected to the anode of a zener diode 81 and to one terminal of a 0.47 μF capacitor 82. The other terminal of capacitor 82 is connected by way of line 19 to the mid-terminal ground 22. The cathode of the zener diode 81 also is connected to the mid-terminal ground 22, and to the anode of a zener diode 83. The cathode of diode 83 is electrically connected to a first terminal of a 0.47 μF capacitor 84, the other terminal of which is electrically connected to line 19. The cathode of diode 83 also is electrically connected to the collector of transistor 61.

The collector of transistor 77 further is electrically connected by way of line 21 and a line 85 to a second input of the coupler 51. The collector of transistor 77 also is connected by way of line 21 to the anode of a zener diode 87 and to one terminal of a 10 μF capacitor 86. The other terminal of capacitor 86 is electrically connected to the cathode of zener diode 87 and to three bias voltage inputs of the coupler 51. The ground terminals of coupler 51 are connected to a line 88 leading to the logging tool ground 23.

The cathode of diode 87 further is electrically connected through a 100 ohm resistor 89 to the anode of a zener diode 90, the cathode of which is connected to line 19.

In order to ensure the proper connection of the couplers 50 and 51 into the circuit of FIG. 3, Table 1 is provided below to match the reference numbers appearing in the drawings with the pin numbers of the ISO150AP coupler as recommended by the manufacturer. It should be recognized, however, that the coupler could be implemented with off-the-shelf discrete components instead of a chip.

TABLE I

| Reference Numbers | Coupler 50 Pin Numbers | Coupler 51 Pin Numbers |
| --- | --- | --- |
| 13 | 24 | 24 |
| 23 | 22, 23 | 22, 23 |
| 24 | 2, 3 | 2, 3 |
| 56 | 10 | |
| 58 | 11, 14, 15 | |
| 85 | | 10 |
| Cathode Of Zener Diode 87 | | 11, 14, 15 |
| Base Electrode Of Transistor 61 | 13 | |
| Base Electrode Of Transistor 78 | | 13 |

In operation, the bi-directional current switch of FIG. 3 receives a sequence of logic signals from the signal processing electronics of the logging tool on line 13 which are applied to the data inputs of the capacitive couplers 50 and 51. The logic signals are supplied at the outputs of the couplers, with the output of coupler 50 referenced to +50 VDC and the output of coupler 51 referenced to −50 VDC.

With reference to line 19 of FIG. 3, a first network of electronics above line 19 and the load 18 responds to negative going logic signals at the output of coupler 50, and a second network of electronics illustrated below line 19 and load 18 responds to positive going logic signals supplied at the output of coupler 51. As the two networks collectively form a complementary-symmetric circuit and operate similarly, the operation of only the first network is described below.

The bias circuits comprised of zener diode 52, resistor 53, zener diode 54 and capacitor 55 provide the voltages recommended by the manufacturer of the capacitive coupler 50 for normal operation. When the output of the coupler 50 is negative relative to the line 20 potential, transistor 61 is closed and transistor 59 is open, thereby negatively charging the gate electrode of the MOSFET transistor 60 with respect to line 20 to cause the transistor to close and current to flow between the source and drain and through the load 18 in a first direction.

The zener diode 83 and capacitor 84 act to limit the voltage applied to the gate electrode of transistor 60. Further, the speed of the charge is limited by the output resistance of transistor 61. A wide variety of such transistors are generally known which charge the gates of p-channel FETs having high capacitance in a transition time of the order of tens of nanoseconds.

When the output of the coupler 50 is at zero volts relative to the line 20 potential, transistor 61 is open, and transistor 59 is closed to discharge the gate electrode of transistor 60 and thereby turn it off. In this event, no drain current flows through the load 18 from transistor 60. The discharge time depends upon the output resistance of transistor 59 in saturation, and the fact that the transistor 60 gate threshold is larger than the cut-off voltage required to turn transistor 59 off. Thus, transistor 60 turns off before transistor 59 to allow transistor 59 to control the switching operation of the transistor 60. When the gate electrode of transistor 60 is discharged to a level to hold transistor 59 closed, transistor 60 opens to await a next pulse.

The diode 65 protects the transistor 60 against voltage spikes and large voltage swings in the load which may exceed the source-drain breakdown voltage while the transistor is open. The transistor 60 allows the ±50 VDC switch power supply to charge the capacitors 67 and 68, and thereby store load voltage for use as a supplemental voltage during a next cycle of operation.

In summary, the output of the coupler 50 is applied through the bi-polar emitter follower transistor 61 to charge and discharge the gate electrode of transistor 60. The transistor 59 acts in concert with the transistor 61 to cause a quick turn-off of transistor 60, and thereby prevents the resonant frequency or oscillatory effects in the output of transistor 60 which may occur during partial turn-off conditions. The charge time of the gate electrode is limited by the magnitude of the resistor 62, and is of the order of fifty nanoseconds or less. The discharge time of the gate electrode, which also is of the order of 50 nanoseconds or less, is dependent upon the output resistance of a saturated transistor 59 and the fact that the transistor 59 cut-off voltage is smaller than the FET gate threshold.

The electronic circuit above line 19 and load 18 of FIG. 3, and the electronic circuit below line 19 and load 18, collectively form a complementary-symmetric circuit which works in a push-pull manner to cause current to flow first in one direction through transistor 60 and load 18, and then in the opposite direction through transistor 71 and load 18. A high voltage is thereby created across the load to radiate the subsurface formations. As previously described, the load 18 may be an inductive coil or an acoustic antenna, and couplers 50 and 51 may be either capacitive couplers for high temperature operation or optical couplers for low temperature operation.

Noise abatement occurs from a number of features including the noise isolation provided by the couplers 50 and 51 between their digital control signal inputs on line 13 and their outputs respectively applied to the base electrodes of transistors 61 and 78. Such isolation occurs as a result of the input sections of the couplers being referenced to the logging tool ground 23, and the output sections of the couplers being referenced to the mid-terminal ground 22 of the switch power supply. Without the couplers, noise generated in one of the upper circuit 40 or the lower circuit 30 of FIG. 2 would propagate into the other, and thereby affect the speed at which the current switches in the load 18. Further, the electrical connection of the drains of transistors 60 and 71 to the mid-terminal ground 22 prevents the transistors from self-oscillating. In addition, the line 19 electrical connection to the mid-terminal ground 22 acts to electrically decouple the upper half of the electrical circuit of FIG. 3 from the lower complementary half. Still further, coupling that otherwise would occur as a result of Miller's capacitance is nullified, which results in the extremely small switch transition times (50 nanoseconds or less to charge, fifty nanoseconds or less to discharge).

More particularly, the small transition times are achieved with substantially reduced noise by emitter followers interacting with complementary bi-polar transistors to not only hold the FETs comprising the power output units off until their gate electrodes are charged before allowing the FETs to turn on, but also quickly discharge the gate electrodes to turn the FETs off. In addition, the high input/low output impedances of the emitter followers and FETs serve to provide noise isolation between their respective inputs and outputs.

The above features provide noise isolation between the output load 18 and the digital control signal on line 13, and between the ±50 VDC power supply and the +5 VDC power supply.

Figure 4:
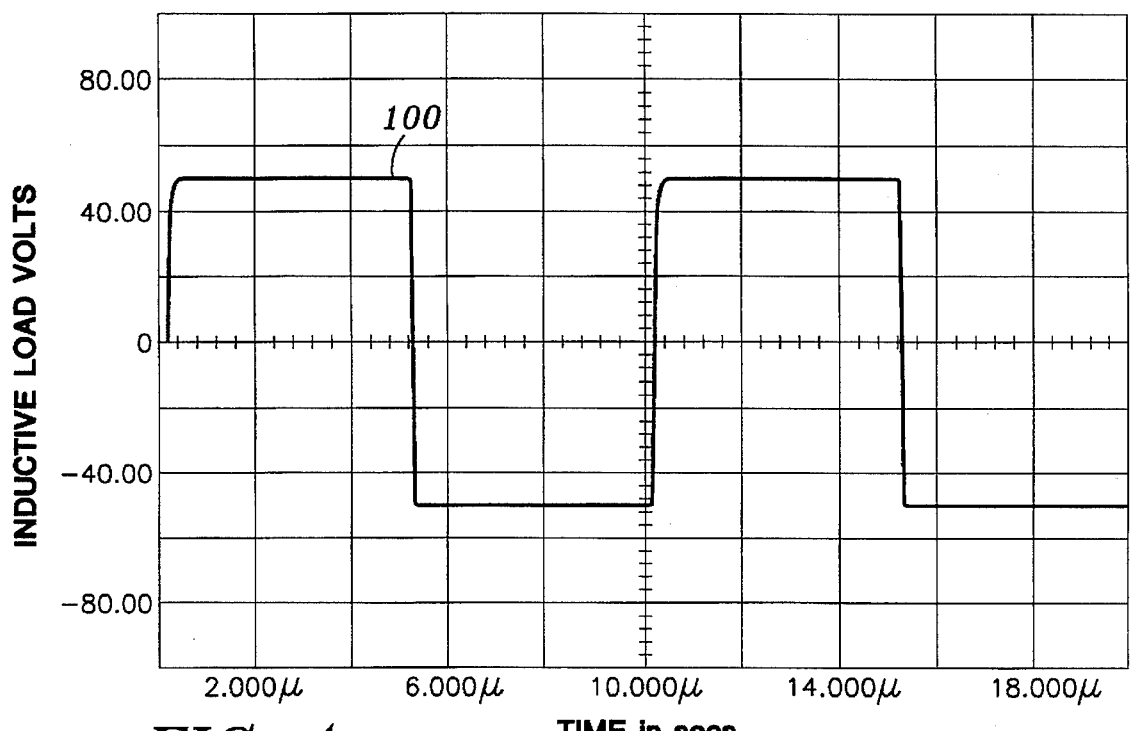
FIG. 4 is a graph of simulated inductive load voltage transitions occurring during the operation of upper circuit 40 of FIG. 2 in accordance with the invention.

Referring to FIG. 4, a graph of simulated inductive load transitions occurring during the operation of upper circuit 40 of FIG. 2 is illustrated for an input digital control frequency of 100 KHz and load voltage swings of approximately ±50 volts. The load was a 500 µH inductive coil made of wire having a resistance of 0.5 ohms. As illustrated by the load voltage signal 100, the charge and discharge transition times of transistor 60 were approximately 50 to 60 nanoseconds.

Figure 5:
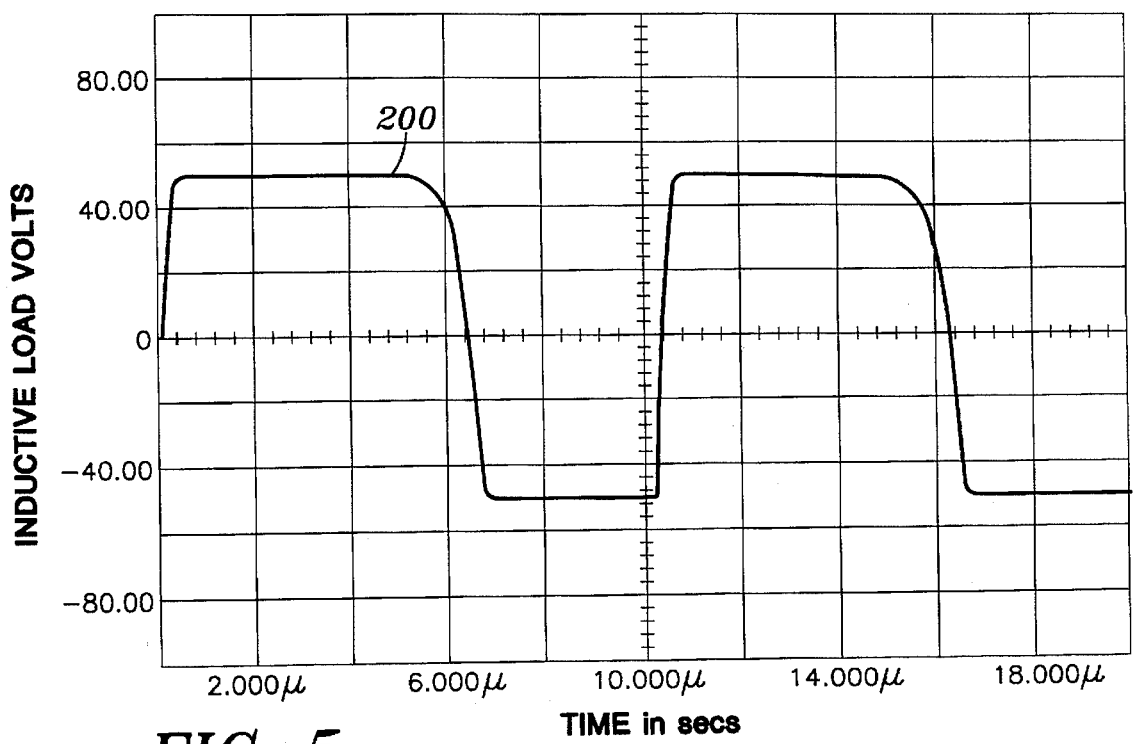
FIG. 5 is a graph of simulated inductive load voltage transitions occurring during the operation of upper circuit 40 with transistor 59 and resistor 63 removed from driver unit 14.

The operation of upper circuit 40 also was simulated under same conditions with the transistor 59 and resistor 63 removed from the driver unit 14 as illustrated in FIG. 5 by load voltage signal 200. In this case, the charge transition time approaches 50 to 60 nanoseconds, but the discharge transition time approaches about 500 nanoseconds. The dramatic effect of transistor 59 operating in concert with transistor 61 is thus apparent.

The bi-directional current switch circuit of FIG. 3 also was bench tested at temperatures up to 180° C. with a switch power supply of ±50 Volts and an input digital control signal ranging from 20 KHz to 200 KHz. Two amperes peak were applied to a coil made of wire with a resistance of 0.5 ohms, and having an inductance of $4 \times 10^{-4}$ H. Test results showed that charge transition times did not exceed 40 nanoseconds, while discharge times were less than 50 nanoseconds.

Further, the digital couplers 50 and 51 may be implemented in discrete components rather than a chip so that the bi-directional switch of FIG. 3 consists only of discrete components. The temperature range of operation of the switch then would be limited only by the operating characteristics of the individual components which operate at temperatures up to 350° C.

Those skilled in the art will appreciate that modifications to the invention may be made without departing from the teaching of the claims. For example, the digital couplers 50 and 51 of FIG. 3 may be transformers, or either capacitive or optical couplers; the load 18 may be inductive or acoustical; and the bi-directional switch of the present invention may easily be adapted for a single terminal power supply, bridge switch configuration, as well as for a dual terminal power supply, complementary pair switch configuration.

Still further, the digital couplers 50 and 51 may be implemented as discrete components for operation in temperatures up to 350° C.

What is claimed is:

1. A low power current switch responsive to a digital control signal received from a signal source for providing a high frequency current to a load in a borehole logging tool operating at a high temperature, which comprises:

power supply means for providing a voltage source;

current means responsive to said digital control signal and electrically connected to said voltage source and said current means for supplying a charge voltage for turning said current means on and off;

control means responsive to said digital control signal, and electrically connected to said voltage source, said switch means and said current means for holding said current means in a turn-off state until said current means is fully charged before allowing said current means to turn on, and for fast discharging of said current means to turn said current means off; and a digital coupler means electrically connected to said switch means and receiving said digital control signals from said signal source for electrically decoupling said load from said signal source.

2. The low-power current switch of claim 1, wherein said current means is a p-channel MOSFET power transistor, said switch means is a PNP transistor, said control means is an NPN transistor, and said voltage source has a positive potential.

3. The low-power current switch of claim 1, wherein said current means is an n-channel MOSFET power transistor, said switch means is an NPN transistor, said control means is a PNP transistor, and said voltage source has a negative potential.

4. The low-power current switch of claim 1, wherein said load is an induction coil.

5. The low-power current switch of claim 1, wherein said load is an acoustical antenna.

6. The low-power current switch of claim 1, wherein a gate threshold voltage of said current means is larger than a cut-off voltage of said control means.

7. The low-power current switch of claim 1, wherein said high frequency is up to 200 KHz, said high temperature is up to 350° C., and said current means switches from said turn-off state to a turn-on state in less than 50 nanoseconds, and switches from said turn-on state to said turn-off state in less than 50 nanoseconds.

8. A low power current switch responsive to a digital control signal received from a signal source for providing a high frequency current to a load in a borehole logging tool operating at a high temperature, which comprises:

a power supply for providing a positive voltage source and having a first ground reference in electrical communication with said load;

a p-channel MOSFET power transistor for applying said high frequency current to said load in a first direction and having a source electrode electrically connected to said positive voltage source, a drain electrode electrically connected to said load and a gate electrode;

an NPN bi-polar transistor having a first collector electrode electrically connected to said source electrode, a first emitter electrode electrically connected to said gate electrode and a first base electrode, for holding said p-channel MOSFET power transistor off until said gate electrode is charged before allowing said p-channel MOSFET power transistor to turn on, and for limiting a discharge time for said gate electrode to turn said p-channel MOSFET power transistor off;

a PNP bi-polar transistor having a second base electrode for receiving said digital control signal, a second emitter electrode electrically connected to said first emitter electrode and said gate electrode, and a second collector electrode;

a first resistor providing an electrical path from said second base electrode and said first base electrode;

a second-resistor providing an electrical path from said second emitter electrode to said positive voltage source and to said first collector electrode for limiting a charge time of said gate electrode; and voltage bias means including a zener diode connected in parallel with a capacitor electrically connected to said first ground reference and said second collector electrode for limiting a voltage magnitude of said gate electrode.

9. The current switch set forth in claim 8, wherein said positive voltage source is changed to a negative voltage source, said p-channel MOSFET power transistor is changed to an n-channel MOSFET power transistor and said high frequency current is applied to said load in a second direction, said NPN bi-polar transistor is changed to a PNP bi-polar transistor, and said PNP bi-polar transistor is changed to an NPN bi-polar transistor.

10. The current switch of claim 8, wherein said high frequency current has a frequency up to 200 KHz, and said high temperature is up to 200° C.

11. The current switch set forth in claim 8, wherein said discharge time is less than 50 nanoseconds, and said charge time is less than 50 nanoseconds.

12. The current switch set forth in claim 8, wherein said load is an inductive load.

13. The current switch set forth in claim 8, wherein said load is an acoustical load.

14. The current switch set forth in claim 8, wherein a gate threshold voltage of said p-channel MOSFET power transistor is larger than a base cut-off voltage required to turn said NPN bi-polar transistor off.

15. A low power, low noise bi-directional current switch with a high switching speed for applying current to an inductive load in response to a digital control signal from a logging tool signal processing system referenced to a logging tool ground, which comprises:

a dual terminal power supply having a positive reference voltage and a negative reference voltage of equal magnitude, and a switch power supply ground galvanically separated from said logging tool ground;

first digital coupler means electrically connected to said dual terminal power supply and said logging tool signal processing system, and receiving said digital control signal and said positive reference voltage, for supplying a first output of said digital control signal referenced to said positive reference voltage, and for electrically decoupling said logging tool sisal processing system from said inductive load;

second digital coupler means electrically connected to said dual terminal power supply and said logging tool signal processing system and receiving said digital control signal and said negative reference voltage for supplying a second output of said digital control signal referenced to said negative reference voltage and for electrically isolating said logging tool signal processing system from said inductive load;

first driver means electrically connected to said first digital coupler means and said dual terminal power supply, and receiving said first output and said positive reference voltage for supplying first charge and discharge voltages;

first power output means electrically connected to said dual terminal power supply and said first driver means, and receiving said positive reference voltage and responsive to said first charge and discharge voltages for turning on and off at said high switching speed to supply current to said inductive load in a first direction;

second driver means electrically connected to said second digital coupler means and said dual terminal power supply, and receiving said second output and said negative reference voltage for supplying second charge and discharge voltages: and second power output means electrically connected to said dual terminal power supply and said second driver means, and receiving said negative reference signal and responsive to said second charge and discharge voltages for turning on and off at said high switching speed to supply current to said inductive load in a second direction.

16. The bi-directional current switch set forth in claim 15 wherein said first power output means is a p-channel MOSFET transistor having a first gate electrode, a first source electrode electrically connected to said dual terminal power supply and receiving said positive reference voltage, and a first drain electrode electrically connected through said inductive load to said switch power supply ground, and wherein said second power output means is an n-channel MOSFET transistor having a second gate electrode electrically decoupled from said first gate electrode, a second source electrode electrically connected to said dual terminal power supply and receiving said negative reference voltage, and a second drain electrode electrically connected through said inductive load to said switch power supply ground, thereby preventing self-oscillation between said first power output means and said second power output means.

17. The bi-directional current switch set forth in claim 15 wherein said first charge and discharge voltages from said first driver means and said second charge and discharge voltages from said second driver means are electrically decoupled from each other.

18. The bi-directional current switch set forth in claim 16, wherein said first driver means is comprised of a first NPN bi-polar transistor having a first collector electrode electrically connected to said first source electrode and said dual terminal power supply and receiving said positive reference voltage, a first emitter electrode electrically connected to said first gate electrode, and a first base electrode, and wherein said first driver means further is comprised of a first PNP bi-polar transistor having a second emitter electrode electrically connected to said first gate electrode and electrically connected through a first resistor to said dual terminal power supply and said first collector electrode, and having a second base electrode electrically connected said first digital coupler means and receiving said first output and electrically connected through a second resistor to said first base electrode, and having a second collector electrode.

19. The bi-directional current switch set forth in claim 18, wherein said second driver means is comprised of a second PNP bi-polar transistor having a third collector electrode electrically connected to said second source electrode and said dual terminal power supply and receiving said negative reference voltage, a third emitter electrode electrically connected to said second gate electrode, and a third base electrode, and wherein said second driver means further is comprised of a second NPN bi-polar transistor having a fourth emitter electrode electrically connected to said third emitter electrode and electrically connected through a third resistor to said third collector electrode, and having a fourth base electrode electrically connected to second digital coupler means and receiving said second output and electrically connected through a fourth resistor to said third base electrode, and having a fourth collector electrode electrically decoupled from said second collector electrode.

20. The bi-directional current switch of claim 15, wherein said bi-directional current switch operates at temperatures up to 200° C., said first power output means and said second power output means have charge and discharge transition times less than 50 nanoseconds, said inductive load is a coil having an inductance of $4 \times 10^{-4}$ H and a load current of 2 amperes peak or more, said positive reference voltage is +50 VDC, said negative reference voltage is −50 VDC, and said digital control signal has a frequency up to 200 KHz.

21. The bi-directional current switch of claim 15, wherein said first digital coupler means and said second digital coupler means consist of only discrete components, and said bi-directional current switch operates at temperatures up to 350° C.

22. The bi-directional current switch set forth in claim 18 wherein a first gate threshold voltage of said first power output means is larger in absolute magnitude than a first cut-off voltage required to turn said first NPN bi-polar transistor off.

23. The bi-directional current switch set forth in claim 19, wherein a second gate threshold voltage of said second power output means is larger in absolute magnitude than a second cut-off voltage required to turn said second PNP bi-polar transistor off.

24. The bi-directional current switch set forth in claim 15, wherein said first digital coupler means and said second digital coupler means are capacitive couplers.

25. The bi-directional current switch set forth in claim 15, wherein said first digital coupler means and said second digital coupler means are optical couplers for operation at temperatures below 200° C.

26. The bi-directional current switch set forth in claim 15, wherein said first digital coupler means and said second digital coupler means are transformers.

27. The bi-directional current switch set forth in claim 15, wherein said inductive load is changed to an acoustical toad.

28. The bi-directional current switch set forth in claim 15, wherein a first circuit comprised of said positive reference voltage, said first digital coupler means, said first driver means and said first power output means is electrically decoupled from a second circuit comprised of said negative reference voltage, said second digital coupler means, said second driver means and said second power output means.

* * * * *